United States Patent
Kim et al.

(10) Patent No.: US 12,149,251 B2
(45) Date of Patent: Nov. 19, 2024

(54) FREQUENCY MULTIPLIER EQUIPPED WITH ADAPTIVE VOLTAGE CONTROL BLOCK AND METHOD THEREFOR

(71) Applicant: Samsung Electronics Co., Ltd., Suwon-si (KR)

(72) Inventors: Hyeongjin Kim, Suwon-si (KR); Hyohyun Nam, Suwon-si (KR); Dongki Kim, Suwon-si (KR); Dae Young Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/156,106

(22) Filed: Jan. 18, 2023

(65) Prior Publication Data
US 2023/0378943 A1   Nov. 23, 2023

(30) Foreign Application Priority Data

May 17, 2022  (KR) .......................... 10-2022-0060042
Jun. 8, 2022  (KR) .......................... 10-2022-0069395

(51) Int. Cl.
*H03K 5/00*   (2006.01)
*H03K 17/56*   (2006.01)
*H03K 5/08*   (2006.01)

(52) U.S. Cl.
CPC ......... *H03K 5/00006* (2013.01); *H03K 17/56* (2013.01); *H03K 5/08* (2013.01)

(58) Field of Classification Search
CPC ...... H03K 5/00006; H03K 5/08; H03K 17/56; H03D 7/1441; G06G 7/16; H03B 19/20; H02M 5/297; H02M 5/10; H02M 5/16
See application file for complete search history.

(56) References Cited

U.S. PATENT DOCUMENTS 6,366,166 B1 *  4/2002  Belot ...................... H03F 3/191
                                                         330/252
6,664,824 B2 * 12/2003  Laws ...................... H03B 19/14
                                                         327/119
(Continued)

FOREIGN PATENT DOCUMENTS

JP    2001-196963 A    7/2001
JP    2010-239415 A   10/2010
(Continued)

OTHER PUBLICATIONS

International Search Report dated Feb. 9, 2023, issued in International Application No. PCT/KR2022/008241.

*Primary Examiner* — Tuan T Lam
(74) *Attorney, Agent, or Firm* — Jefferson IP Law, LLP

(57) ABSTRACT

The present disclosure relates to a communication method and system for converging a 5th-Generation (5G) communication system or a 6th-Generation (6G) communication system for supporting higher data rates beyond a 4th-Generation (4G) system. A frequency multiplier of a wireless communication system is provided. The frequency multiplier includes an input circuit to which a local oscillator (LO) signal is input, a multiplier circuit having one end connected to the input circuit and another end connected to a lower terminal of a load circuit, a load circuit having an upper terminal connected to a voltage controller, and a voltage controller configured between the upper terminal of the load circuit and an input power source, wherein the voltage controller may be configured to drop a voltage between the input power source and the upper terminal of the load circuit and reinput a feedback voltage based on an upper terminal voltage of the load circuit to the voltage controller, and a method of multiplying a frequency using the same.

18 Claims, 14 Drawing Sheets

(56) References Cited

U.S. PATENT DOCUMENTS

| | | | |
|---|---|---|---|
| 8,258,827 B2 * | 9/2012 | Chang | H03B 19/14 |
| | | | 327/119 |
| 9,806,701 B1 | 10/2017 | Bellaouar et al. | |
| 11,139,841 B2 * | 10/2021 | Lee | H03B 19/14 |
| 11,632,090 B1 * | 4/2023 | Wu | H03F 3/45183 |
| | | | 330/252 |
| 2006/0019622 A1 | 1/2006 | Domino et al. | |
| 2010/0248647 A1 | 9/2010 | Wachi | |
| 2011/0187420 A1 * | 8/2011 | Kuo | H03B 5/1228 |
| | | | 327/119 |
| 2014/0139274 A1 * | 5/2014 | Lee | H03K 5/00006 |
| | | | 327/119 |
| 2014/0198550 A1 | 7/2014 | Sankaran et al. | |
| 2015/0077192 A1 | 3/2015 | Sadhu et al. | |
| 2018/0159516 A1 | 6/2018 | Ye et al. | |
| 2019/0393882 A1 | 12/2019 | Bassi et al. | |
| 2020/0241480 A1 | 7/2020 | Bahr et al. | |
| 2020/0303833 A1 | 9/2020 | Ueda | |
| 2021/0391853 A1 | 12/2021 | Jann et al. | |
| 2023/0018212 A1 * | 1/2023 | Papotto | H03K 5/00006 |

FOREIGN PATENT DOCUMENTS

| | | |
|---|---|---|
| KR | 10-2020-0018972 A | 2/2020 |
| KR | 10-2021-0106881 A | 8/2021 |

\* cited by examiner

FREQUENCY MULTIPLIER EQUIPPED WITH ADAPTIVE VOLTAGE CONTROL BLOCK AND METHOD THEREFOR

CROSS-REFERENCE TO RELATED APPLICATION(S)

This application is based on and claims priority under 35 U.S.C. § 119(a) of a Korean patent application number 10-2022-0060042, filed on May 17, 2022, in the Korean Intellectual Property office, and of a Korean patent application number 10-2022-0069395, filed on Jun. 8, 2022, in the Korean Intellectual Property Office, the disclosure of each of which is incorporated by reference here in its entirety.

BACKGROUND

1. Field

The disclosure relates to a frequency multiplier used in a frequency band of a wireless communication system and a method of using the same.

2. Description of Related Art

Considering the development of mobile communication from generation to generation, the technologies have been developed mainly for services targeting humans, such as voice calls, multimedia services, and data services. Following the commercialization of 5G (5th-generation) communication systems, it is expected that the number of connected devices will exponentially grow. Increasingly, these will be connected to communication networks. Examples of connected things may include vehicles, robots, drones, home appliances, displays, smart sensors connected to various infrastructures, construction machines, and factory equipment. Mobile devices are expected to evolve in various form-factors, such as augmented reality glasses, virtual reality headsets, and hologram devices. In order to provide various services by connecting hundreds of billions of devices and things in the 6G (6th-generation) era, there have been ongoing efforts to develop improved 6G communication systems. For these reasons, 6G communication systems are referred to as Beyond-5G systems.

6G communication systems, which are expected to be commercialized around 2030, will have a peak data rate of tera (1,000 giga)-level bps and a radio latency less than 100 μsec, and thus will be 50 times as fast as 5G communication systems and have the 1/10 radio latency thereof.

In order to accomplish such a high data rate and an ultra-low latency, it has been considered to implement 6G communication systems in a terahertz band (for example, 95 GHz to 3 THz bands). It is expected that, due to severer path loss and atmospheric absorption in the terahertz bands than those in mmWave bands introduced in 5G, technologies capable of securing the signal transmission distance (that is, coverage) will become more crucial. It is necessary to develop, as major technologies for securing the coverage, multiantenna transmission technologies including radio frequency (RF) elements, antennas, novel waveforms having a better coverage than OFDM, beamforming and massive MIMO, full dimensional MIMO (FD-MIMO), array antennas, and large-scale antennas. In addition, there has been ongoing discussion on new technologies for improving the coverage of terahertz-band signals, such as metamaterial-based lenses and antennas, orbital angular momentum (OAM), and reconfigurable intelligent surface (RIS).

Moreover, in order to improve the spectral efficiency and the overall network performances, the following technologies have been developed for 6G communication systems: a full-duplex technology for enabling an uplink (UE transmission) and a downlink (node B transmission) to simultaneously use the same frequency resource at the same time; a network technology for utilizing satellites, high-altitude platform stations (HAPS), and the like in an integrated manner; an improved network structure for supporting mobile nodes B and the like and enabling network operation optimization and automation and the like; an use of AI in wireless communication for improvement of overall network operation by considering AI from the initial phase of developing technologies for 6G and internalizing end-to-end AI support functions; and a next-generation distributed computing technology for overcoming the limit of UE computing ability through reachable super-high-performance communication and computing resources (MEC, clouds, and the like) over the network.

It is expected that such research and development of 6G communication systems will bring the next hyper-connected experience to every corner of life. Particularly, it is expected that services such as truly immersive XR, high-fidelity mobile hologram, and digital replica could be provided through 6G communication systems.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an improved frequency multiplier used in a frequency band of a wireless communication system and a method of using the same.

Another aspect of the disclosure is to provide a multiplier capable of varying output power and stably supplying power by maintaining a wide range of output power, and a method of using the same.

Another aspect of the disclosure is to provide a multiplier having a voltage control block configured using an active load and a reconfigurable feedback circuit to adaptively change power applied to a load of the multiplier depending on input power.

Additional aspects will be set forth in part in the description which follows and, in part, will be apparent from the description, or may be learned by practice of the presented embodiments.

In accordance with an aspect of the disclosure, a frequency multiplier of a wireless communication system is provided. The frequency multiplier includes an input circuit to which a local oscillator (LO) signal is input, a multiplier circuit having one end connected to the input circuit and the other end connected to a lower terminal of a load circuit, the load circuit having an upper terminal connected to a voltage controller, and a voltage controller configured between the upper terminal of the load circuit and an input power source, wherein the voltage controller may drop a voltage between the input power source and the upper terminal of the load circuit and reinput a feedback voltage based on the upper terminal voltage of the load circuit to the voltage controller.

In accordance with another aspect of the disclosure, a method performed by a frequency multiplier of a wireless communication system is provided. The method includes receiving a local oscillator (LO) signal through an input circuit, multiplying the LO signal through a multiplier circuit having one end connected to the input circuit and the other end connected to a lower terminal of a load circuit, performing a first voltage drop through the load circuit having an upper terminal connected to a voltage controller, and controlling a voltage through the voltage controller configured between the upper terminal of the load circuit and an input power source, wherein the voltage controller may be configured to drop a voltage between the input power source and the upper terminal of the load circuit and reinput a feedback voltage based on an upper terminal voltage of the load circuit to the voltage controller.

The technical tasks to be solved by the embodiments of the disclosure are not limited to the above-mentioned tasks, and other tasks not mentioned will be clearly understood by those skilled in the art to which the display pertains from the description below.

According to various embodiments of the disclosure, it is possible to provide an improved frequency multiplier used in a frequency band of a wireless communication system and a method of using the same.

In addition, various embodiments of the disclosure are able to provide a multiplier capable of varying output power and stably supplying power by maintaining a wide range of output power, and a method of using the same.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

Figure 1:
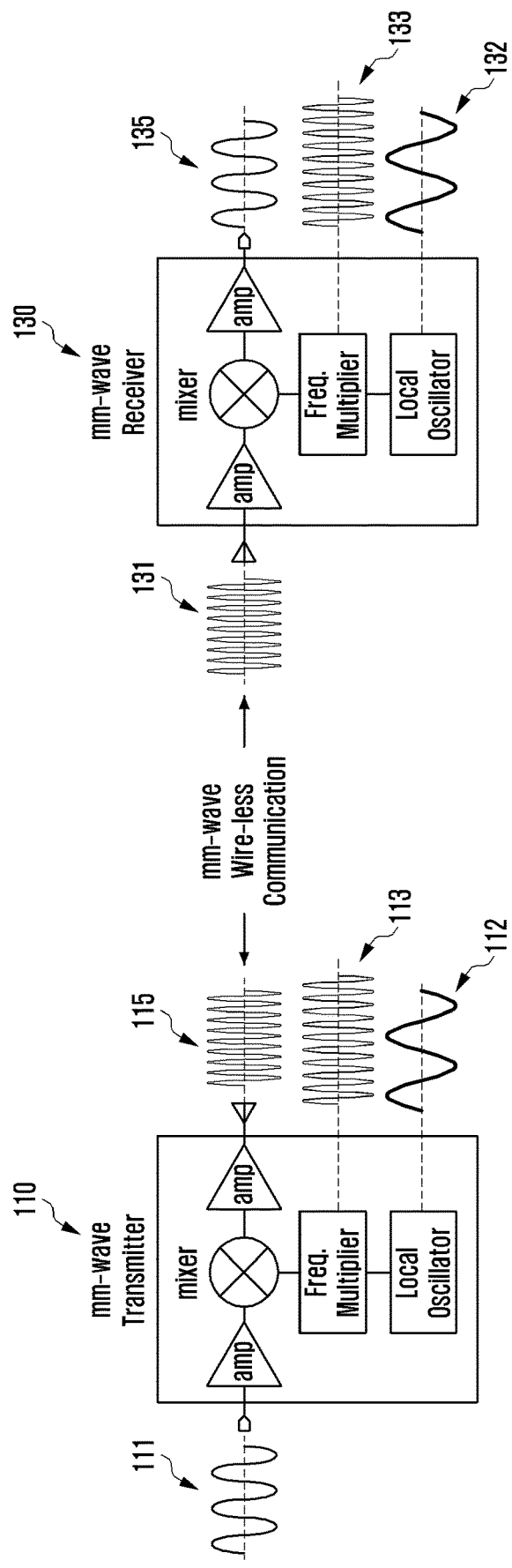
FIG. 1 is a diagram illustrating an example of a transmitter and a receiver of a wireless communication system according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In describing embodiments of the disclosure, descriptions related to technical contents well-known in the art and not associated directly with the disclosure will be omitted. Such an omission of unnecessary descriptions is intended to prevent obscuring of the main idea of the disclosure and more clearly transfer the main idea.

For the same reason, in the accompanying drawings, some elements may be exaggerated, omitted, or schematically illustrated. Further, the size of each element does not completely reflect the actual size. In the drawings, identical or corresponding elements are provided with identical reference numerals.

The advantages and features of the disclosure and ways to achieve them will be apparent by making reference to embodiments as described below in detail in conjunction with the accompanying drawings. However, the disclosure is not limited to the embodiments set forth below, but may be implemented in various different forms. The following embodiments are provided only to completely disclose the disclosure and inform those skilled in the art of the scope of the disclosure, and the disclosure is defined only by the scope of the appended claims. Throughout the specification, the same or like reference numerals designate the same or like elements.

Herein, it will be understood that each block of the flowchart illustrations, and combinations of blocks in the flowchart illustrations, can be implemented by computer program instructions. These computer program instructions can be provided to a processor of a general-purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

Further, each block of the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

As used in embodiments of the disclosure, the "unit" refers to a software element or a hardware element, such as a Field Programmable Gate Array (FPGA) or an Application Specific Integrated Circuit (ASIC), which performs a predetermined function. However, the "unit" does not always have a meaning limited to software or hardware. The "unit" may be constructed either to be stored in an addressable storage medium or to execute one or more processors. Therefore, the "unit" includes, for example, software elements, object-oriented software elements, class elements or task elements, processes, functions, properties, procedures, sub-routines, segments of a program code, drivers, firmware, micro-codes, circuits, data, database, data structures, tables, arrays, and parameters. The elements and functions provided by the "unit" may be either combined into a smaller number of elements, or a "unit", or divided into a larger number of elements, or a "unit". Moreover, the elements and "units" or may be implemented to reproduce one or more central processing units (CPUs) within a device or a security multimedia card.

In the following description, a base station is an entity that allocates resources to terminals, and may be at least one of a Node B, a base station (BS), an eNode B (eNB), a gNode B (gNB), a wireless access unit, a base station controller, and a node on a network. A terminal may include a user equipment (UE), a mobile station (MS), a cellular phone, a smartphone, a computer, or a multimedia system capable of performing communication functions. Furthermore, in the following description, the embodiments of the disclosure may also be applied to other communication systems having similar technical backgrounds or channel types. In addition, based on determinations by those skilled in the art, the embodiments of the disclosure may also be applied to other communication systems through some modifications without significantly departing from the scope of the disclosure. Examples of such communication systems may include 5th generation mobile communication technologies (5G, new radio, and NR) developed beyond long term evolution advanced (LTE-A), and in the following description, the "5G" may be the concept that covers the exiting long term evolution (LTE), LTE-A, or other similar services. In addition, based on determinations by those skilled in the art, the embodiments of the disclosure may also be applied to other communication systems through some modifications without significantly departing from the scope of the disclosure. The details of the disclosure may be employed in frequency division duplex (FDD) and time division duplex (TDD) systems.

In the following description, terms for identifying access nodes, terms referring to network entities, terms referring to messages, terms referring to interfaces between network entities, terms referring to various identification information, and the like are illustratively used for the sake of convenience. Therefore, the disclosure is not limited by the terms as used below, and other terms referring to subjects having equivalent technical meanings may be used.

In the following description, some of terms and names defined in the 3rd generation partnership project (3GPP) long term evolution (LTE) and/or 3GPP new radio (NR) standards may be used for the convenience of description. However, the disclosure is not limited by these terms and names, and may be applied in the same way to systems that conform other standards.

Various embodiments of the disclosure relate to an efficient frequency multiplier. A frequency multiplier is a circuit configured to output a frequency of an integer multiple of an input frequency when a signal is output from an electronic circuit. The frequency multiplier is a circuit designed to distort an input signal and take only a necessary harmonic component from the output thereof according to a filter.

A frequency multiplier according to various embodiments of the disclosure may be used in various devices configured to receive an input of frequency or output a frequency. For example, the frequency multiplier may be included in a transceiver of various devices for transmitting and receiving frequencies, as well as in a transceiver of a terminal or a base station.

FIG. 1 is a diagram illustrating an example of a transmitter and a receiver of a wireless communication system according to an embodiment of the disclosure.

Referring to FIG. 1, a transmitter 110 may include an amplifier amp, a mixer, a frequency multiplier, a local oscillator (LO), and the like. In addition, a receiver 130, similarly to the transmitter 110, may include an amplifier amp, a mixer, a frequency multiplier, a local oscillator (LO), and the like. The transmitter 110 and the receiver 130 are represented by simplifying configurations related to the disclosure, and the structures of the transmitter 110 and the receiver 130 are not limited thereto.

In a wireless communication system, output signals 115 and 135 that is up-/down-converted to a carrier frequency through a mixer using input signals 111 and 131 having information and LO signals 112 and 132 may be obtained, enabling transmission and reception of information. A wireless communication system in a millimeter-wave frequency band requires an LO signal of high frequency, and at this time, a phased locked loop (PLL) for generating a high frequency band must be locked to a signal of wide bandwidth, which makes it difficult to implement the system. To this end, a process of generating a stable signal through a PLL in a low frequency band and then multiplying the frequency by N times is required (see 113 and 133), and various embodiments of the disclosure propose a frequency multiplier capable of varying output power and stably supplying power by maintaining a wide range of output power.

Figure 2:
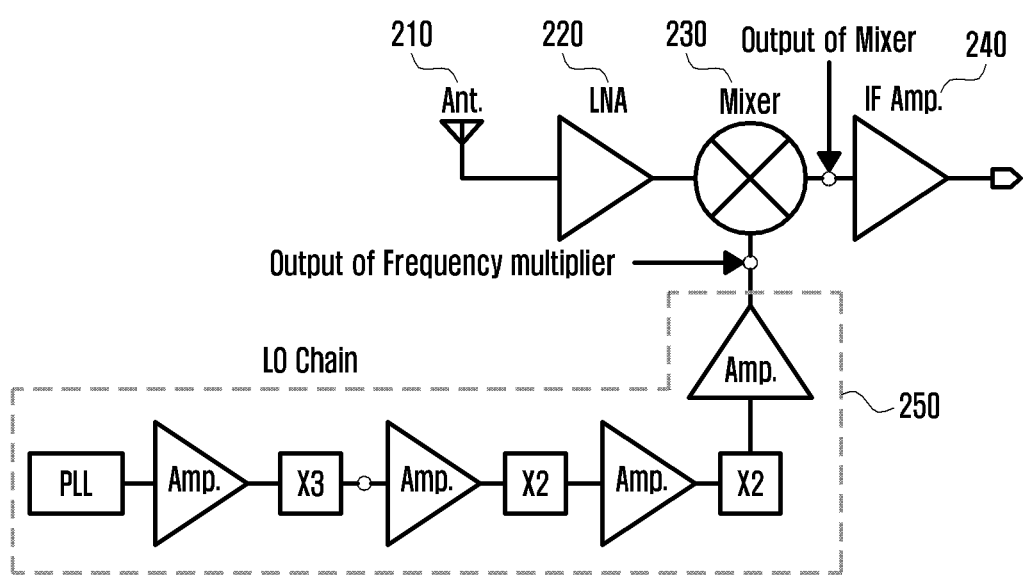
FIG. 2 is a diagram illustrating an example of a receiver of a wireless communication system according to an embodiment of the disclosure.

FIG. 2 is a diagram illustrating an example of a receiver of a wireless communication system according to an embodiment of the disclosure.

Referring to FIG. 2, a receiver may include an antenna (Ant) 210 for receiving wireless communication signals, a low-noise amplifier (LNA) 220, a mixer 230, an intermediate frequency amplifier (IF amp) 240, and a local oscillator (LO) chain 250. An output of the LO chain is input to the mixer. The LO chain may include a PLL, at least one amplifier, and at least one frequency multiplier. The blocks X3 and X2 of the LO chain indicate frequency multipliers. For example, the block X2 is an example of a frequency multiplier for multiplying 2 times.

A radio frequency (RF) transceiver for wireless communication is a device that generates a baseband signal at a low frequency and converts the same up and down to a high frequency signal using a mixer, thereby receiving (converting the signal to an IF or baseband signal using an RF signal and an LO signal) or transmitting (converting the signal to an RF signal using an IF or baseband signal and an LO signal) signals. The mixer is designed using the non-linear characteristics of a transistor and may have a high and constant conversion gain when a stable LO signal of a fixed power level is supplied. Therefore, in order to supply a stable LO signal to the mixer, it is important that the output level of the frequency multiplier remains constant at a level where the conversion gain of the mixer is maximized.

Figure 3:
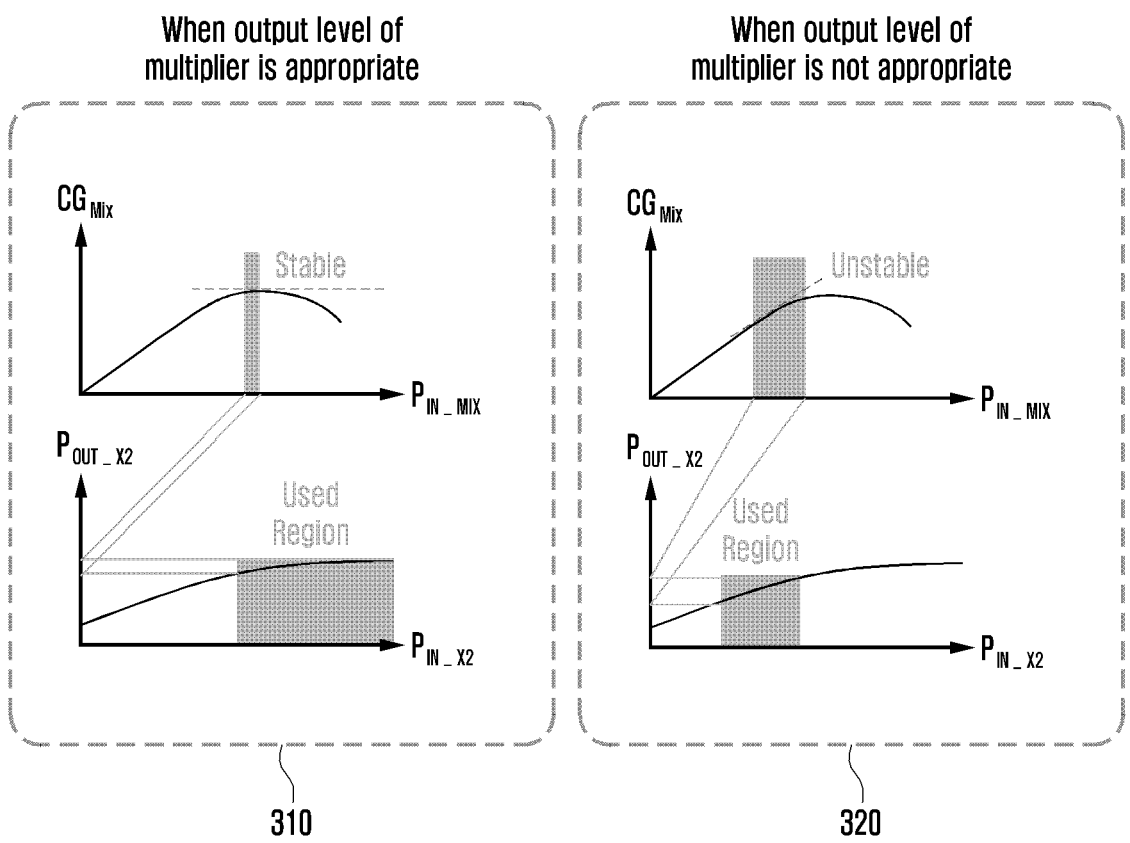
FIG. 3 is a diagram illustrating a conversion gain of a mixer depending on a change in the output level of a multiplier according to an embodiment of the disclosure.

FIG. 3 is a diagram illustrating a conversion gain of a mixer depending on a change in the output level of a multiplier according to an embodiment of the disclosure.

Referring to FIG. 3, reference numeral 310 denotes an example in which the output level of a multiplier is appropriate, and reference numeral 320 denotes an example in which the output level of a multiplier is not appropriate. $P_{IN\_X2}$ is an input of a PLL, and $P_{OUT\_X2}$ is an output of a multiplier. $P_{IN\_MIX}$ is a value at which the output of the multiplier is input to the mixer, and $CG_{Mix}$ is a conversion gain (CG) of the mixer.

Referring to reference numeral 310, it can be seen that $P_{OUT\_X2}$ is saturated at a low level of $P_{IN\_X2}$ and it can be seen that $CG_{Mix}$ remains constant with respect to $P_{IN\_MIX}$ because $P_{OUT\_X2}$ is constant. On the other hand, referring to reference numeral 320, it can be seen that $P_{OUT\_X2}$ is saturated at a high level of $P_{IN\_X2}$ and it can be seen that $CG_{MIX}$ does not remain constant with respect to $P_{IN\_MIX}$ because $P_{OUT\_X2}$ is not constant. Referring to this, it can be seen that the constant maintenance of $P_{OUT\_X2}$ in the region where $P_{IN\_X2}$ is used affects the conversion gain of the mixer. Referring to FIG. 3, it can be seen that an appropriate output level of the multiplier is required to keep the conversion gain of the mixer constant.

Figure 4:
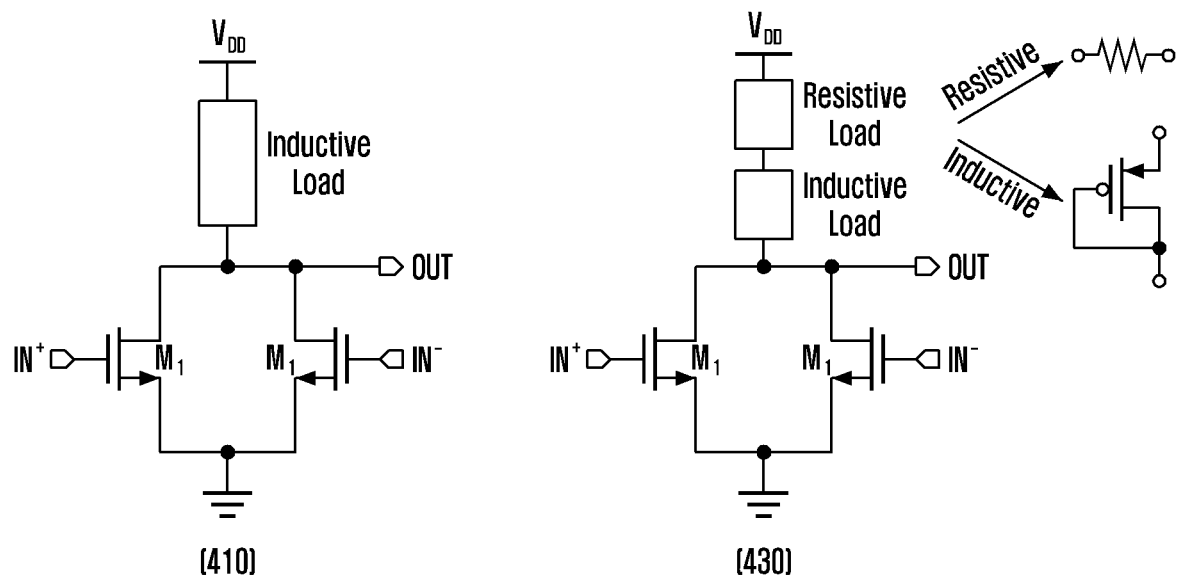
FIG. 4 is a diagram illustrating the structure of a differential frequency multiplier according to an embodiment of the disclosure.

FIG. 4 is a diagram illustrating the structure of a differential frequency multiplier according to an embodiment of the disclosure.

FIG. 4 shows a frequency multiplier 410 used in an mm-wave RF transceiver. The frequency multiplier 410 is generally implemented such that an output terminal is fixed to a differential amplifier structure so that the output frequency is double the input frequency, and an inductive load is used for high frequency operation. At this time, the inductive load has a low resistance value due to a relatively high quality factor (Q), so a voltage drop from a power source $V_{DD}$ to a node applied to a transistor is little. Therefore, a high head-room is formed in a transistor M1 of the frequency multiplier 410 and saturated at high input power. When saturation occurs at a high input level, the signal output to the mixer for normal input is not stable. That is, as described in FIG. 3, when saturation occurs at a high input level, the output in the used region is not stable, so the conversion gain of the mixer is not stable.

In order to solve the above problem, it may be considered in the frequency multiplier 430 that a resistive load is added between the inductive load and the power source $V_{DD}$. A resistive load for De-Q is generally used in the frequency multiplier 430 for the purpose of lowering the head-room of the transistor to saturate the multiplier at low input power. Here, the resistive load may be divided into a passive type and an active type. Since the passive type has a large variation due to processes, a diode-connected active type (a type in which a gate and a drain of a transistor are bound together) may generally be used for the resistive load.

Figure 5:
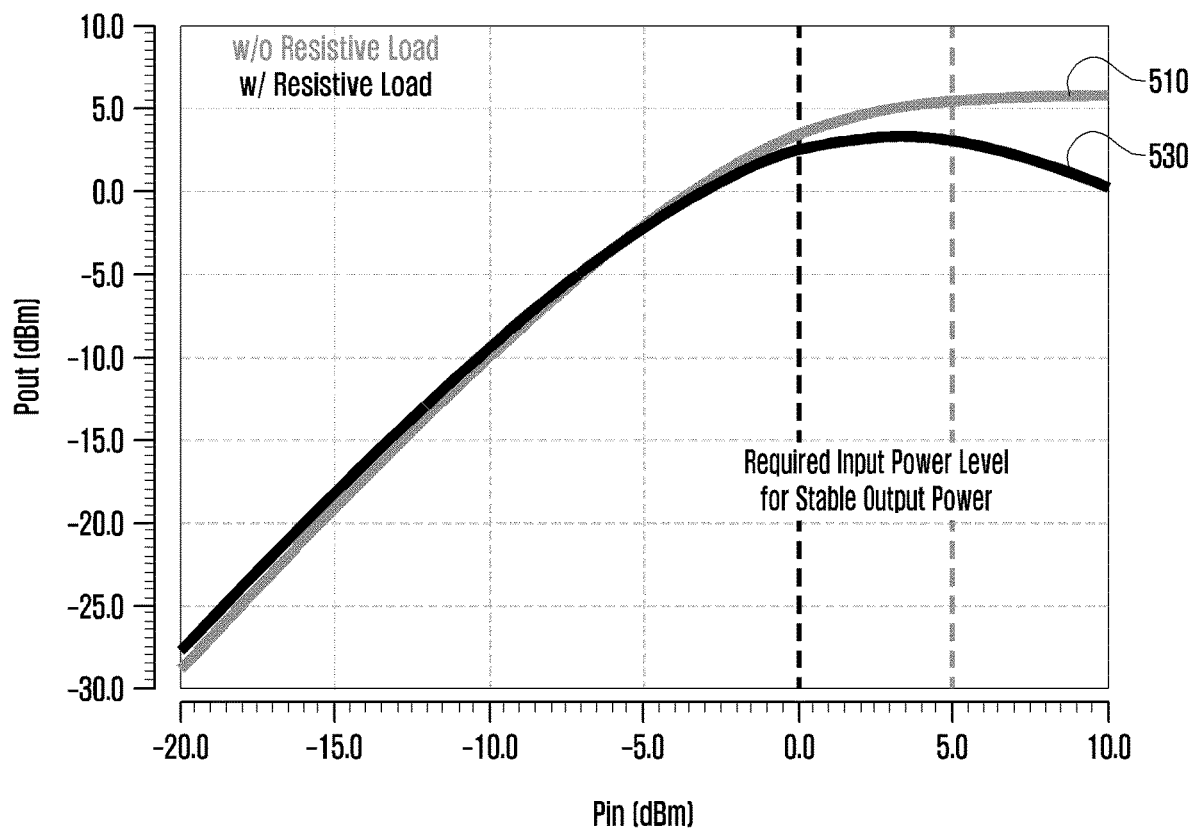
FIG. 5 is a diagram illustrating an output level of a frequency multiplier depending on a change in an input level thereof according to an embodiment of the disclosure.

FIG. 5 is a diagram illustrating an output level of a frequency multiplier depending on a change in an input level thereof according to an embodiment of the disclosure.

Referring to FIG. 5, $P_{in}$ corresponds to an input value IN in the embodiment of the frequency multiplier in FIG. 4, and Pout corresponds to an output value OUT in the embodiment of the frequency multiplier in FIG. 4. In the embodiment shown in FIG. 5, 510 represents an output level depending on an input level when a resistive load is not used, and 530 represents an output level depending on an input level when a resistive load is used.

When the resistive load is not used (510), it can be seen that Pout (dBm) is not saturated until the section where Pin (dBm) is 5.0 and that Pout (dBm) is saturated in the section where Pin (dBm) is greater than 5.0. On the other hand, when the resistive load is used (530), it can be seen that Pout (dBm) is saturated in the section where Pin (dBm) is 0 to 5.0. Through this, it can be seen that the output input to the mixer is saturated at high input power when the resistive load is not used, the output input to the mixer is not stable. In addition, it can be confirmed that since the output power input to the mixer is saturated even at low input power when the resistive load is used, the output input to the mixer is stable. Therefore, when using a resistive load, the output input to the mixer may be stably controlled.

Figure 6:
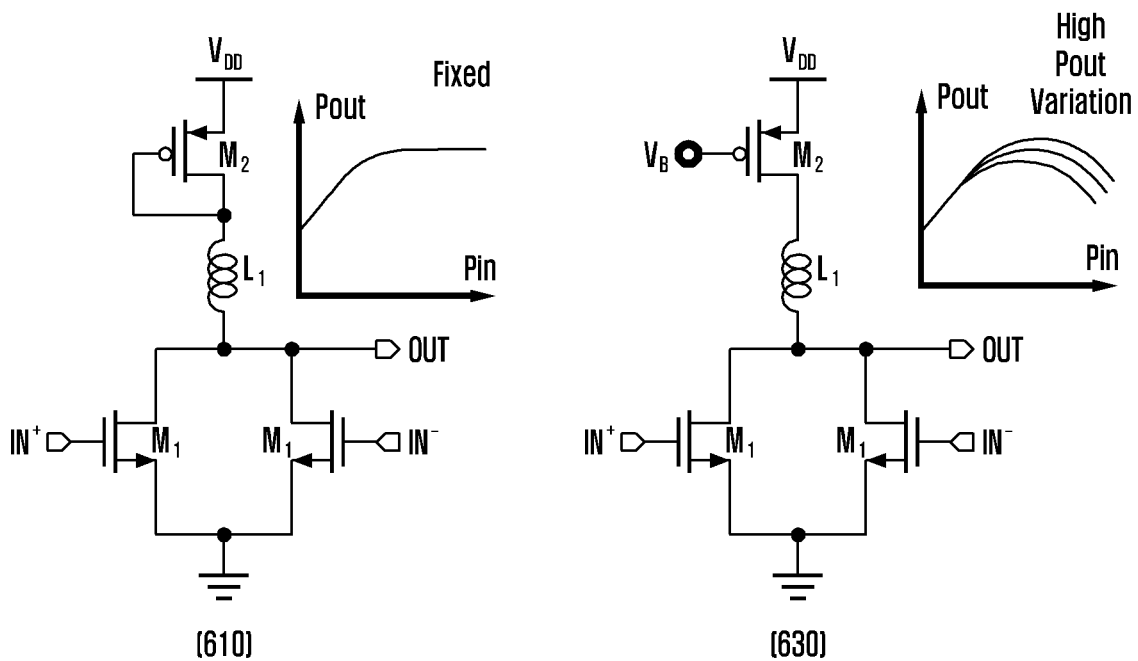
FIG. 6 is a diagram illustrating the structure of a frequency multiplier using an active type resistive load according to an embodiment of the disclosure.

FIG. 6 is a diagram illustrating the structure of a frequency multiplier using an active type resistive load according to an embodiment of the disclosure.

Referring to FIG. 6, reference numeral 610 denotes an example in which the gate and drain of a transistor are bound in configuring an active type resistive load, and reference numeral 630 denotes an example in which a bias voltage is input to the gate of a transistor in configuring a resistive load.

A diode-connected active load is always saturated, and the resistance value thereof is determined by the drain voltage of M1. Therefore, it is impossible to change the output power of the frequency multiplier. Referring to the drawing about Pin and Pout of reference numeral 610, it can be confirmed that the output power Pout of the frequency multiplier is constant. Meanwhile, as shown in reference numeral 630, a bias voltage may be used for the gate of the active load. In this case, it can be confirmed that the output power changes depending on the bias voltage. Therefore, if the bias voltage is used for the active load, it is possible to adjust the output power of the frequency multiplier. However, referring to reference numeral 630, it can be seen that as the input power increases, the drain voltage rapidly decreases due to the fixed bias voltage, and thus the output power also rapidly decreases. That is, when the bias voltage is applied, the output power may be changed, but the output power is not saturated and rapidly decreases.

In summary, it is possible to saturate the output level at a lower input level when using a resistive load, compared to when not using a resistive load. An active load is generally used as the resistive load, and the output level is stable from a low input level when an active load is used as shown in reference numeral 610, but it is impossible to produce a variable output level. In the case of using an active load as shown in reference numeral 620, the output level may be varied but may decrease rapidly when a high input level is received. Therefore, a frequency multiplier capable of obtaining a stable output level even at a low input level and obtaining a variable output level as needed is required.

An improved frequency multiplier according to an embodiment of the disclosure will be described below. According to the following embodiment, the frequency multiplier is configured by an active load and includes a circuit capable of adaptive voltage control. Through this, it is possible to implement a multiplier capable of vary the output power of the frequency multiplier and maintaining a wide range of output power by self-biasing even when the input power becomes high, thereby supplying stable LO power to the mixer.

Figure 7:
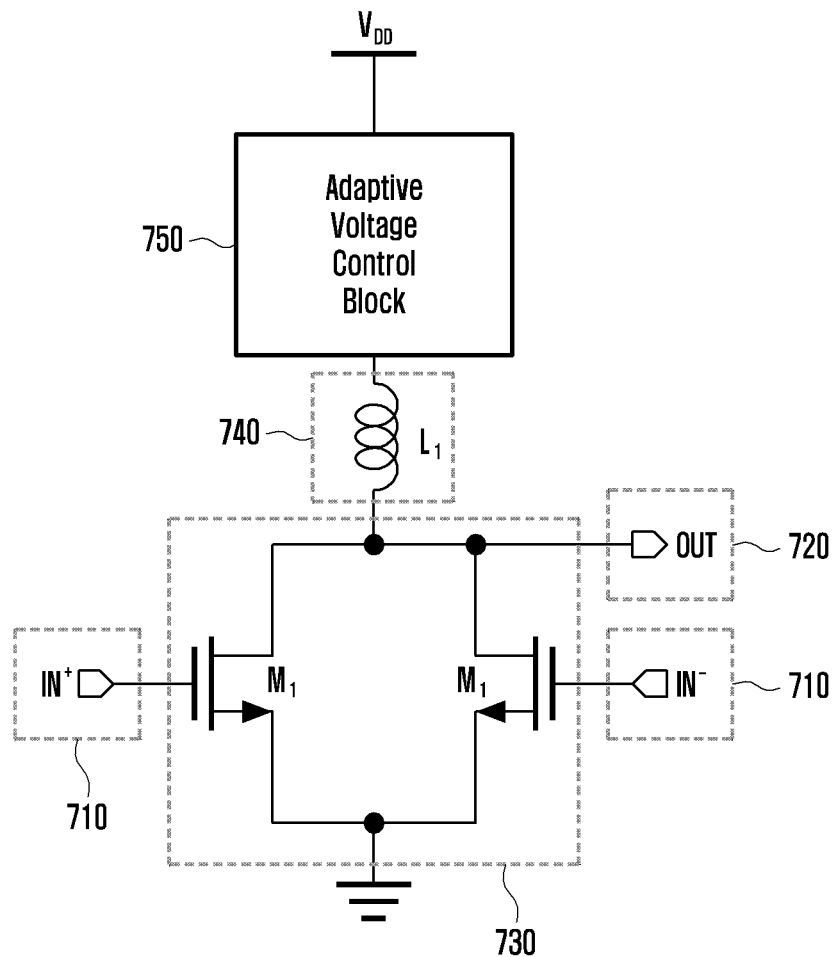
FIG. 7 is a diagram illustrating a frequency multiplier having an adaptive voltage control block according to an embodiment of the disclosure.

FIG. 7 is a diagram illustrating a frequency multiplier having an adaptive voltage control block according to an embodiment of the disclosure.

Referring to FIG. 7, a frequency multiplier may include an input unit 710, an output unit 720, a multiplier unit 730, a load unit 740, and a voltage control block 750. The load unit 740 may be an inductive load. The voltage control block 750 may also be referred to as an "adaptive voltage control block", "adaptive voltage controller", or "voltage controller" but is not limited thereto.

The input unit 710 functions to receive an input signal for the frequency multiplier. An LO signal may be input through the input unit 710. The input unit 710 may be connected to the multiplier unit 730. The input unit 710 may provide input signals having different phases to different transistors of the multiplier unit 730.

The multiplier unit 730 may be configured as a pair of transistors M1. A gate end of the multiplier unit 730 may be connected to the input unit 710 having an opposite phase. A gate terminal of one of the pair of transistors may be connected to the input unit 710 having a + phase, and a gate terminal of the other transistor may be connected to the input unit 710 having a – phase. A source terminal of the pair of transistors M1 may be connected to the ground, and a drain terminal of the pair of transistors M1 may be connected to each other and may be connected to the load unit 740.

The load unit 740 may be implemented as a transmission line or may be implemented in the form of a transformer as well. The load unit 740 is located between the multiplier unit 730 and the voltage control block 750. An upper terminal of the load unit 740 may be connected to the voltage control block 750, and a lower terminal of the load unit 740 may be connected to the multiplier unit 730. A lower terminal of the load unit 740 is connected to the drain terminal of the pair of transistors M1 in the multiplier unit 730 and is connected to the output unit 720.

The output unit 720 is connected to the load unit 740 and the multiplier unit 730. The voltage of the unit to which the load unit 740 and the multiplier unit 730 are connected may be used as an output value (output voltage or output power) of the output unit 720. The output unit 720 may be connected to a mixer, and an output value of the output unit 720 may be used as an input value to the mixer.

The voltage control block 750 may be located between the power source VDD and the load unit 740. An upper terminal of the voltage control block 750 may be connected to the power source VDD, and a lower terminal of the voltage control block 750 may be connected to the load unit 740. The voltage control block 750 may perform a voltage drop function for the power source VDD and function to variably adjust the voltage applied to the upper end of the load unit 740 through the voltage drop. In addition, the voltage control block 750 may perform adaptive voltage control through a feedback loop. The voltage control block 750 may include an active load and a feedback circuit, and the structure of the voltage control block 750 is not limited thereto. The active load may include one or two or more transistors, and a variable feedback circuit may be connected between an output and an input of the active load. The feedback circuit may be connected between the drain terminal and the gate terminal of the active load. The feedback circuit may include an element or structure (variable resistor) for controlling the current flowing through the transistor M2 of the active load. The feedback circuit may control the current flowing through the transistor M2 using a variable element or structure. The structures of the active load and feedback circuit will be described in more detail later.

Figure 8:
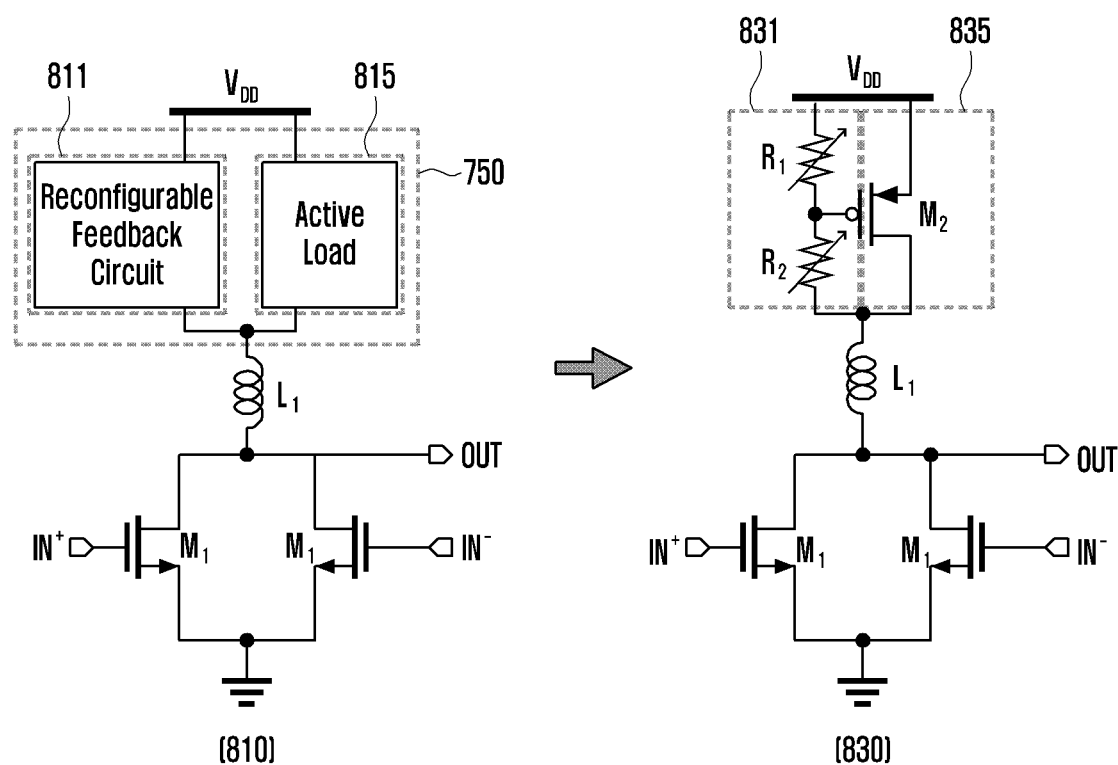
FIG. 8 is a diagram illustrating a frequency multiplier having an embodied voltage control block according to an embodiment of the disclosure.

FIG. 8 is a diagram illustrating a frequency multiplier having an embodied voltage control block according to an embodiment of the disclosure.

Referring to FIG. 8, the frequency multiplier in FIG. 8 is obtained by embodying the voltage control block 750 in the embodiment of FIG. 7. General description of the frequency multiplier has been made with reference to FIG. 7 and may also be applied to the embodiment in FIG. 8, so the description in FIG. 7 will be referred to. First, referring to reference numeral 810, the voltage control block 750 may include a feedback circuit 811 and an active load 815. The feedback circuit 811 may be defined as a reconfigurable feedback circuit but is not limited thereto.

The upper terminal of the feedback circuit 811 may be connected to a power source VDD, and the lower terminal of the feedback circuit 811 may be connected to a load unit. In addition, the middle terminal of the feedback circuit 811 may be connected to the active load 815. Similarly, the upper terminal of the active load 815 may be connected to the power source VDD, the lower terminal of the active load 815 may be connected to the load unit, and the middle terminal of the active load 815 may be connected to the feedback circuit 811.

The active load 815 serves to perform voltage drop. The active load 815 serves to perform voltage drop between VDD and the load unit. The feedback circuit 811 may serve to input an input based on a feedback value to the active load 815. A current flowing through the active load 815 may vary depending on a voltage applied to a gate of a transistor included in the active load 815. The feedback circuit 811 may input the feedback input voltage to the active load 815 according to the voltage difference between VDD and the upper end of the load unit, and the configuration of the feedback circuit 811. The feedback circuit may provide a new input value to the active load 815 depending on a change in the voltage value of the upper end of the load unit.

Through this, even if the input value of the frequency multiplier changes, it may operate to output a stable output value.

Reference numeral 830 shows a feedback circuit 831 by embodying the feedback circuit 811 in the configuration of reference numeral 810 and shows an active load 835 by embodying the active load 815.

The feedback circuit 831 may include a first variable resistor R1 and a second variable resistor R2. An upper terminal of the first variable resistor R1 may be connected to VDD, and a lower terminal thereof may be connected to an upper terminal of the second variable resistor R2 and a gate terminal of the active load 835. The upper terminal of the second variable resistor R2 may be connected to a lower terminal of the first variable resistor R1 and the gate terminal of the active load 835. A lower terminal of the second variable resistor R2 may be connected to a drain terminal of the active load 835. A voltage difference between VDD and the upper end of a resistor based on the resistance ratio of the first variable resistor R1 and the second variable resistor R2 may be input to the active load 835. The current flowing through the active load 835 and the voltage drop value in the active load 835 may vary depending on the voltage input to the gate terminal. If resistance values of the variable resistors R1 and R2 are adjusted, the degree of voltage drop occurring in a transistor M2 of the active load 835 changes, and the output level of the multiplier may be adjusted using this. Adjusting the resistance values of the variable resistors R1 and R2 may include adjusting the resistance value of at least one of the first variable resistor R1 and the second variable resistor R2. In addition, the variable resistors R1 and R2 may form a feedback loop with the active load 835, thereby operating more stably, compared to the case where the input level changes rapidly.

The operation of the frequency multiplier according to the embodiment in FIGS. 7 and 8 will be described in detail below.

When a signal having a first frequency is received through the input unit 710, a harmonic component of twice or three times the first frequency is generated at the drain terminal of the multiplier unit 730 due to the nonlinear characteristics of the transistor M1. At this time, the outputs of even multiples (e.g., 2 times, 4 times, . . . ) of the first frequency are combined in the process of combining the differential pair, and the outputs of odd multiples (e.g., 1 time, 3 times, 5 times, . . . ) have an opposite phase and cancel out. Therefore, there are only components multiplied by even terms such as 2 times and 4 times the input frequency at the output terminal of the multiplier unit 730, and at this time, if a second frequency (double the first frequency) is matched using impedance matching, it becomes a double frequency multiplier so that the second frequency is output through the output unit 720 to be input to the mixer.

When the input power level increases, the current flowing through the transistor M1 of the differential pair of the multiplier unit 730 also increases, and the current flowing through the load unit 740 and the voltage control block 750 also increases. When the input power level increases beyond a certain point, the drain voltage of the transistor M1 approaches the headroom voltage, thereby reaching a point where the output power level does not increase any more (a saturated state). That is, when the input power level increases beyond a certain point, a large voltage drop occurs in the load unit 740 and the voltage control block 750 due to an increase in current, and the potential actually applied to the transistor M1 is reduced, thereby producing a point where the output power level no longer increases. Using this, it is possible to design a circuit in which the output remains constant even if the input power changes due to external factors at a specific input power level or more.

The transistor M2 of the active loads 815 and 835 connected between $V_{DD}$ and the load unit 740 (inductive load, L1) changes in its on-resistance depending on the voltage applied to the gate. A voltage drop occurs due to the on-resistance value of the active loads 815 and 835 and the current flowing through the drain. This may lower the headroom voltage applied to the transistor M1 of the multiplier unit 730 so that the frequency multiplier is saturated even at a low input level.

In addition, if a feedback loop is formed between the drain and gate terminals of the transistor M2, which operates as an active load, the voltage applied to the gate of the transistor M2 change actively as the headroom voltage of the transistor M1 changes. For example, the operation of the feedback loop may be as follows. If the current flowing through the transistor M2 increases in the case where the input power level rises, and the voltage applied to the upper end of the load unit 740 is reduced. When the voltage applied to the upper end of the load unit 740 is reduced, the voltage corresponding to the variable resistor R2 is applied to the gate terminal of the transistor M2 according to a resistance ratio of the variable resistors R1 and R2. Since the voltage at the upper end of the load unit 740 is lowered, a voltage lower than that of the previous loop is applied to the active loads 815 and 835 again. When the voltage applied to the active loads 815 and 835 is reduced, the current flowing through the transistor M2 decreases again, and since the voltage drop value due to the active load is reduced, the voltage at the upper end of the load unit 740 increases again. As described above, if a feedback loop is configured through the feedback circuits 811 and 831, it is possible to control the voltage at the upper terminal of the load unit 740 in the opposite direction of the change in the external input value and maintain a stable voltage of the load unit 740 so that the output level of the frequency multiplier may be stably maintained, as shown in the example above.

In various embodiments of the disclosure, it is designed to variably adjust the resistance ratio of the first variable resistor R1 and the second variable resistor R2. When the resistance ratio of the variable resistors R1 and R2 is adjusted, the voltage value applied to the gate terminal of the transistor M2 of the active loads 815 and 835 may be adjusted. Through this, it is possible to configure a frequency multiplier that saturates at a low input level while adjusting the output level. That is, as shown in the diagram for Pin and Pout in the embodiment of FIG. 7, saturation occurs from an input level with a low Pin value, and Pout may be controlled to be differently output depending on the adjustment of the resistance ratio.

Figure 9:
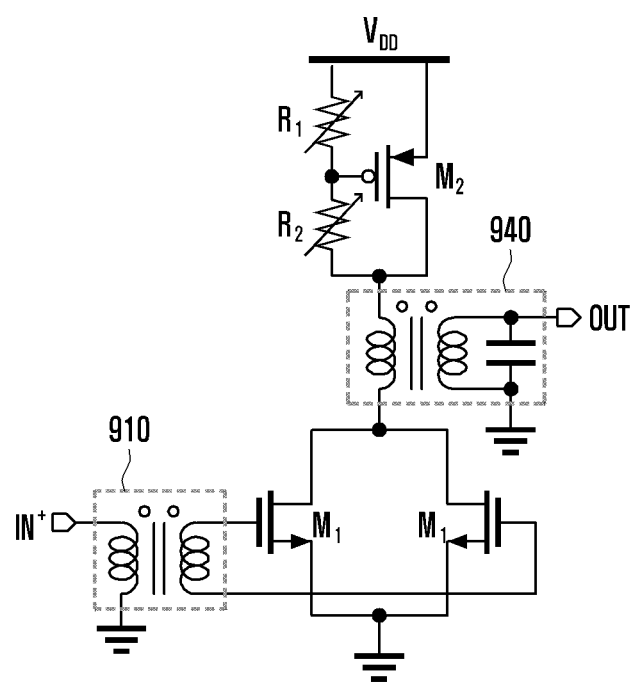
FIG. 9 is a diagram illustrating a frequency multiplier using a transformer according to an embodiment of the disclosure.

FIG. 9 is a diagram illustrating a frequency multiplier using a transformer according to an embodiment of the disclosure.

FIG. 9 is different from the embodiment in FIG. 8 in that a transformer is used in the structure of an input unit 910 and in the structure of a resistor 940. The input unit 910 uses a transformer structure such that an input signal having an opposite phase may be input to each of the transistors M1 of the differential pair. In addition, using a transformer in the resistor 940, an output value according to the value of the transformer may be transferred to the output unit. Meanwhile, since the remaining elements excluding the input unit 910 and the resistor 940 correspond to the embodiments in FIGS. 7 and 8, the respective elements thereof may refer to the descriptions of the embodiments in FIGS. 7 and 8.

Figure 10:
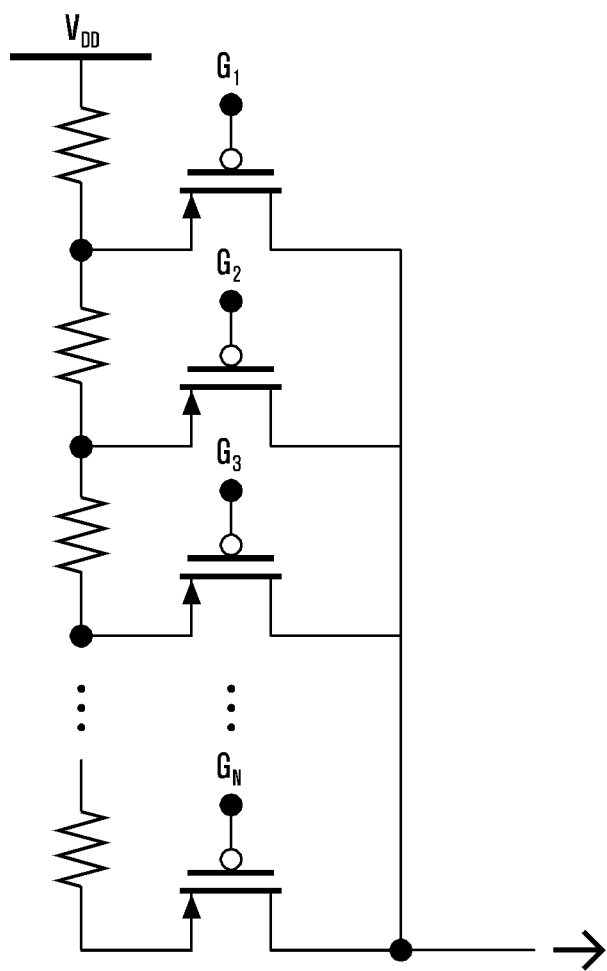
FIG. 10 is a diagram illustrating the configuration of a serial variable resistor according to an embodiment of the disclosure.

FIG. 10 is a diagram illustrating the configuration of a serial variable resistor according to an embodiment of the disclosure.

Referring to FIG. 10, the structure shown in FIG. 10 may constitute one variable resistor. A variable resistor may be configured as a combination of a switch including transistors, and a resistor. Transistors G1, G2, G3, . . . , and GN may be controlled to be turned on and off such that they are recognized as resistors when turned on and not recognized as resistors when turned off.

Figure 11:
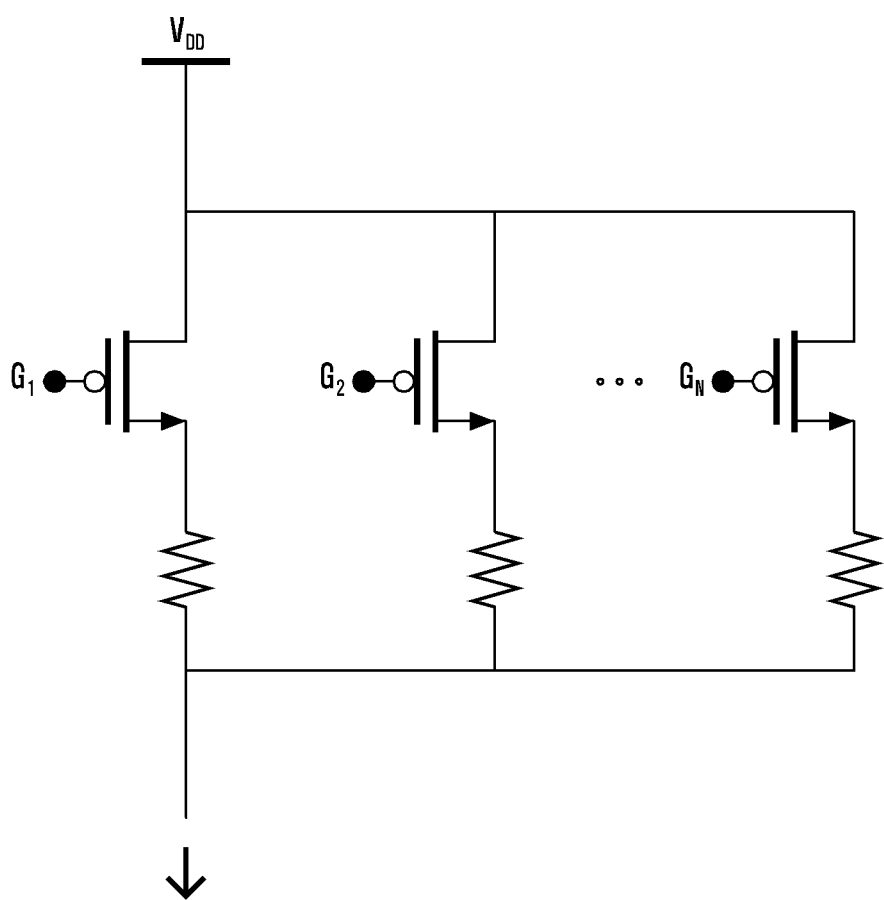
FIG. 11 is a diagram illustrating the configuration of a parallel variable resistor according to an embodiment of the disclosure.

FIG. 11 is a diagram illustrating the configuration of a parallel variable resistor according to an embodiment of the disclosure.

Referring to FIG. 11, the structure shown in FIG. 11 may constitute one variable resistor. A variable resistor may be configured as a combination of a switch including transistors, and a resistor. Transistors G1, G2, . . . , and GN may be controlled to be turned on and off such that they are recognized as resistors when turned on and not recognized as resistors when turned off.

In the embodiments shown in FIG. 10 and/or FIG. 11, the magnitude of variable resistance generated by each variable resistor or the resistance ratio thereof may be adjusted based on process characteristics of a frequency multiplier, external temperature, and the like. That is, the magnitude of variable resistance may be adjusted according to the process characteristics, external temperature, and the like such that the output power of the frequency multiplier produces the highest conversion gain of the mixer. The characteristics of the transistor included in the frequency multiplier may vary depending on the process characteristics, external temperature, and the like. In the embodiment of the disclosure, a device including the frequency multiplier may store a mapping table for resistance values according to the process characteristics and/or external temperature. Accordingly, an appropriate variable resistance value may be selected according to identified process characteristics and/or detected external temperature characteristics. In order to adjust the resistance value of the variable resistor, the voltage applied to the gate of the transistor corresponding to the switch may be adjusted.

Meanwhile, although the method of configuring a variable resistor and the configuration thereof have been described above with reference to FIGS. 10 and 11, the configuration of the variable resistor is not limited thereto. Even if it is not provided in the above example, it is possible to use a combination of serial and parallel types according to a required resistance value, and it is possible to configure variable resistors of various configurations capable of functioning as variable resistors using other additional elements.

Figure 12:
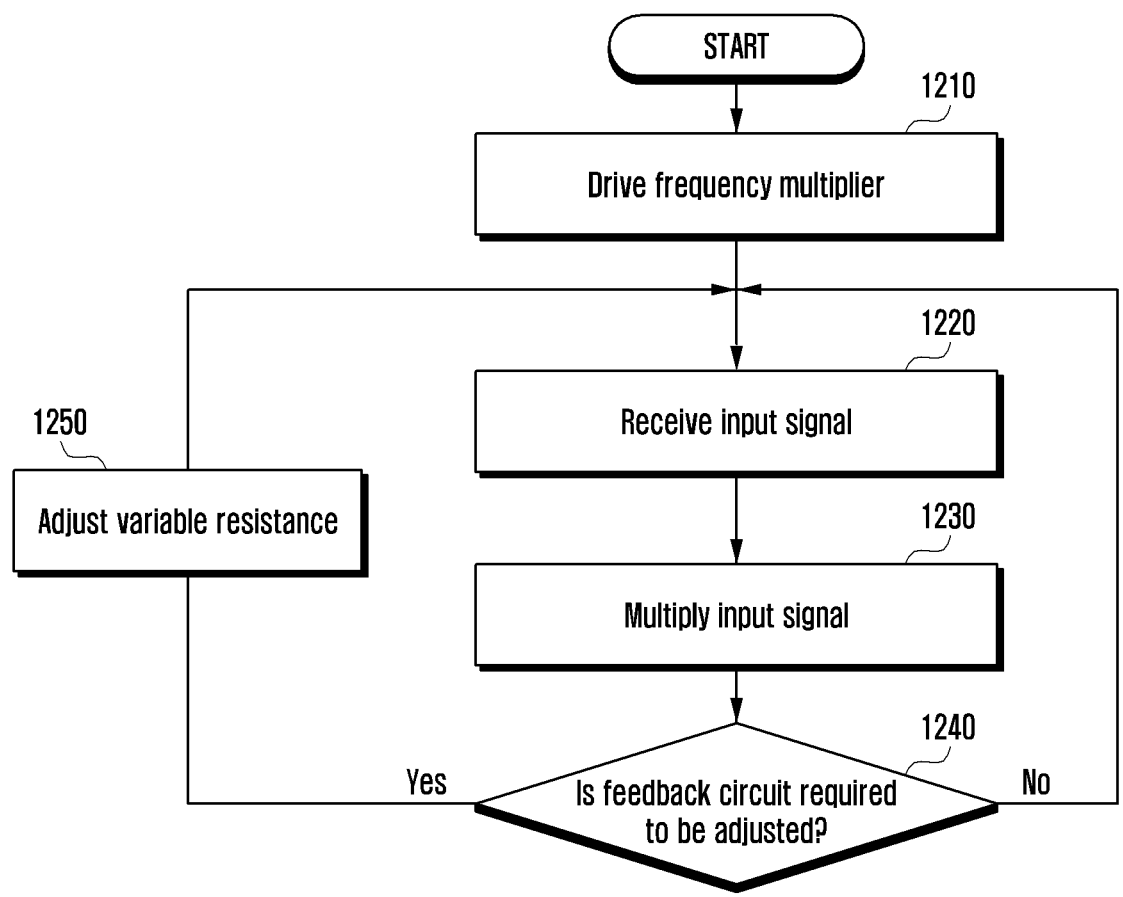
FIG. 12 is a diagram illustrating an adaptive voltage control method of a frequency multiplier according to an embodiment of the disclosure.

FIG. 12 is a diagram illustrating an adaptive voltage control method of a frequency multiplier according to an embodiment of the disclosure.

Referring to FIG. 12, the frequency multiplier of a transceiver may be driven (operation 1210). Power may be applied to the frequency multiplier to drive the frequency multiplier. The input unit of the frequency multiplier acquires an input signal (operation 1220). The input signal may be an LO signal. The input signal may be multiplied by n times in the operation of the frequency multiplier as described above (operation 1230). That is, the input signal may be multiplied n times according to the operation of the multiplier unit, resistor, and voltage control block of the frequency multiplier. The multiplied signal may be input to the mixer through the output unit of the frequency multiplier.

If the frequency multiplier continues to operate, it may be determined whether or not the feedback circuit is required to be adjusted (operation 1240). If it is determined that the feedback circuit is not required to be adjusted, operations 1220 and 1230 may be performed based on the existing configuration of the feedback circuit (previously used configuration of the variable resistor). If it is determined that the feedback circuit is required to be adjusted, operation 1250 may be performed. The frequency multiplier may adjust the magnitude of variable resistance of the feedback circuit (1250). When adjusting the magnitude of variable resistance, the process characteristics and/or external temperature of a device constituting the frequency multiplier may be considered. For example, the magnitude of variable resistance may be adjusted using a pre-stored mapping table. Thereafter, operations 1220 and 1230 may be performed based on the newly adjusted magnitude of variable resistance.

Figure 13:
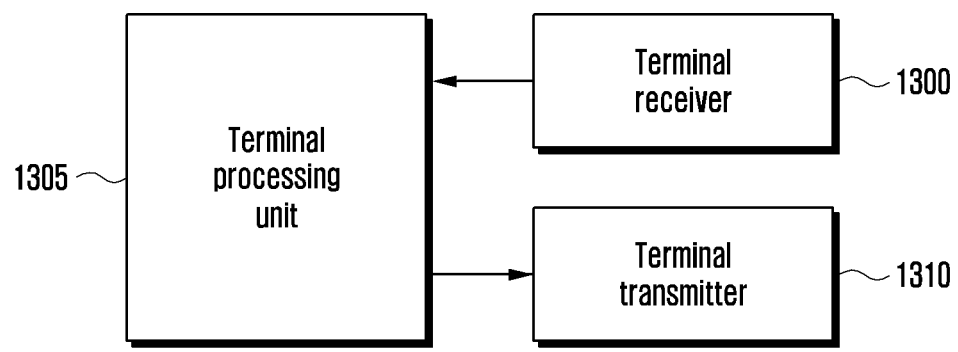
FIG. 13 is a diagram illustrating the configuration of a terminal according to an embodiment of the disclosure.

FIG. 13 is a diagram illustrating the configuration of a terminal according to an embodiment of the disclosure.

FIG. 13 is a diagram illustrating the structure of a terminal in a wireless communication system according to an embodiment of the disclosure.

Referring to FIG. 13, a terminal may include a transceiver that refers to a terminal receiver 1300 and a terminal transmitter 1310, a memory (not shown), and a terminal processing unit 1305 (or a terminal controller or processor). The transceiver 1300 and 1310, the memory, and the terminal processing unit 1305 of the terminal may operate according to the communication method of the terminal described above. However, the elements of the terminal are not limited to the above-described examples. For example, the terminal may include more or fewer elements than the aforementioned elements. In addition, the transceiver, the memory, and the processor may be implemented as a single chip.

The transceiver may transmit/receive signals to/from a base station. Here, the signal may include control information and data. To this end, the transceiver may include an RF transmitter for up-converting and amplifying the frequency of a transmitted signal and an RF receiver for low-noise amplifying a received signal and down-converting the frequency thereof. However, this is only an example of the transceiver, and the elements of the transceiver are not limited to the RF transmitter and the RF receiver.

In addition, the transceiver may receive a signal through a wireless channel, output the signal to the processor, and transmit a signal output from the processor through a wireless channel.

In addition, a frequency multiplier according to various embodiments of the disclosure may be included in the transceiver. The frequency multiplier may be included in the terminal receiver 1300 and the terminal transmitter 1310, respectively.

According to an embodiment of the disclosure, the frequency multiplier may include an input unit to which a local oscillator (LO) signal is input, a multiplier unit having one end connected to the input unit and the other end connected to a lower terminal of the load unit, the load unit having an upper terminal connected to a voltage control block, and the voltage control block configured between the upper terminal of the load unit and an input power source, and the voltage control block may drop the voltage between the input power source and the upper terminal of the load unit and reinput a feedback voltage based on the upper terminal voltage of the load unit to the voltage control block.

Here, the voltage control block may include a feedback circuit and an active load. In addition, the feedback circuit may include a first variable resistor and a second variable resistor, wherein an upper terminal of the first variable resistor may be connected to the input power source and a lower terminal thereof may be connected to an upper terminal of the second variable resistor and the active load, and wherein a lower terminal of the second variable resistor may be connected to an upper terminal of the resistor.

In addition, the active load may include at least one transistor, and a source terminal of the transistor may be connected to the input power source, a drain terminal of the transistor may be connected to the upper terminal of the load unit, and a gate terminal of the transistor may be connected between the first variable resistor and the second variable resistor.

In addition, a feedback voltage may be input to the gate terminal of the transistor, based on the voltage of the upper terminal of the load unit. The feedback voltage may be determined based on a voltage difference between the input power source and the upper terminal of the load unit, and a resistance ratio of the first variable resistor and the second variable resistor.

In addition, the resistance ratio of the first variable resistor and the second variable resistor may be determined based on at least one of the process characteristics of the frequency multiplier or external temperature. Specifically, the resistance ratio may be selected from a mapping table between at least one of the process characteristics of the frequency multiplier or the external temperature and a resistance value.

In addition, the frequency multiplier may include an output unit connected to a lower terminal of the load unit. The output power of the output unit may be input to a mixer of a transceiver. The resistance ratio of the first variable resistor and the second variable resistor may be adjusted such that the output power based on a voltage drop at the active load produces a maximum conversion gain level of the mixer.

The memory may store programs and data required for the operation of the terminal. In addition, the memory may store control information or data included in signals transmitted and received by the terminal. The memory may be configured as a storage medium such as a read only memory (ROM), a random access memory (RAM), a hard disk, a compact disc read only memory (CD-ROM), and a digital versatile disc (DVD), or a combination thereof. In addition, a plurality of memories may be provided.

In addition, the processor may control a series of processes such that the terminal may operate according to the above-described embodiment. For example, the processor may control elements of the terminal so as to simultaneously receive a plurality of physical downlink shared channels (PDSCHs) by receiving downlink control information (DCIs) including two layers. A plurality of processors may be provided, and the processor may execute a program stored in the memory to perform an operation of controlling the elements of the terminal.

Figure 14:
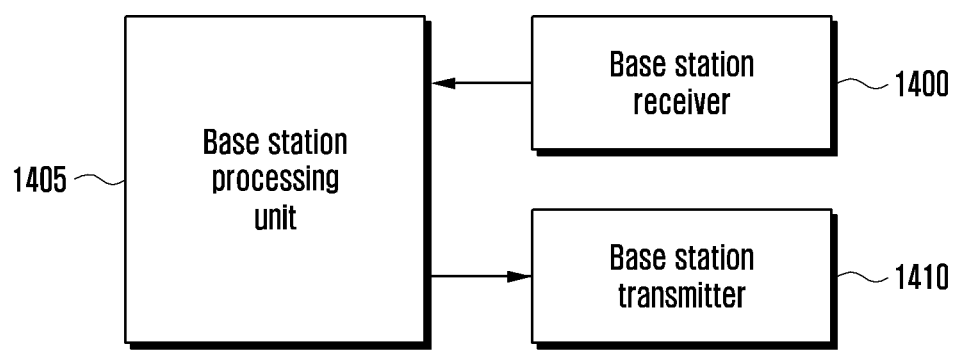
FIG. 14 is a diagram illustrating the configuration of a base station according to an embodiment of the disclosure.

FIG. 14 is a diagram illustrating the configuration of a base station according to an embodiment of the disclosure.

Referring to FIG. 14, a base station may include a transceiver that refers to a base station receiver 1400 and a base station transmitter 1410, a memory (not shown), and a base station processing unit 1405 (or a base station controller or processor). The transceiver 1400 and 1410, the memory, and the base station processing unit 1405 of the base station may operate according to the communication method of the base station described above. However, the elements of the base station are not limited to the above-described examples. For example, the base station may include more or fewer elements than the aforementioned elements. In addition, the transceiver, the memory, and the processor may be implemented as a single chip.

The transceiver may transmit/receive signals to/from a terminal. Here, the signal may include control information and data. To this end, the transceiver may include an RF transmitter for up-converting and amplifying the frequency of a transmitted signal and an RF receiver for low-noise amplifying a received signal and down-converting the frequency thereof. However, this is only an example of the transceiver, and the elements of the transceiver are not limited to the RF transmitter and the RF receiver.

In addition, the transceiver may receive a signal through a wireless channel, output the signal to the processor, and transmit a signal output from the processor through a wireless channel.

In addition, a frequency multiplier according to various embodiments of the disclosure may be included in the transceiver. The frequency multiplier may be included in the base station receiver 1400 and the base station transmitter 1410, respectively.

According to an embodiment of the disclosure, the frequency multiplier may include an input unit to which a local oscillator (LO) signal is input, a multiplier unit having one end connected to the input unit and the other end connected to a lower terminal of the load unit, the load unit having an upper terminal connected to a voltage control block, and the voltage control block configured between the upper terminal of the load unit and an input power source, and the voltage control block may drop the voltage between the input power source and the upper terminal of the load unit and reinput a feedback voltage based on the upper terminal voltage of the load unit to the voltage control block.

Here, the voltage control block may include a feedback circuit and an active load. In addition, the feedback circuit may include a first variable resistor and a second variable resistor, wherein an upper terminal of the first variable resistor may be connected to the input power source and a lower terminal thereof may be connected to an upper terminal of the second variable resistor and the active load, and wherein a lower terminal of the second variable resistor may be connected to an upper terminal of the resistor.

In addition, the active load may include at least one transistor, and a source terminal of the transistor may be connected to the input power source, a drain terminal of the transistor may be connected to the upper terminal of the load unit, and a gate terminal of the transistor may be connected between the first variable resistor and the second variable resistor.

In addition, a feedback voltage may be input to the gate terminal of the transistor, based on the voltage of the upper terminal of the load unit. The feedback voltage may be determined based on a voltage difference between the input power source and the upper terminal of the load unit, and a resistance ratio of the first variable resistor and the second variable resistor.

In addition, the resistance ratio of the first variable resistor and the second variable resistor may be determined based on at least one of the process characteristics of the frequency multiplier or external temperature. Specifically, the resistance ratio may be selected from a mapping table between at least one of the process characteristics of the frequency multiplier or the external temperature and a resistance value.

In addition, the frequency multiplier may include an output unit connected to a lower terminal of the load unit. The output power of the output unit may be input to a mixer of a transceiver. The resistance ratio of the first variable resistor and the second variable resistor may be adjusted such that the output power based on a voltage drop at the active load produces a maximum conversion gain level of the mixer.

The memory may store programs and data required for the operation of the base station. In addition, the memory may store control information or data included in signals transmitted and received by the base station. The memory may be configured as a storage medium such as a ROM, a RAM, a hard disk, a CD-ROM, and a DVD, or a combination thereof. In addition, a plurality of memories may be provided.

The processor may control a series of processes such that the base station may operate according to the above-described embodiment. For example, the processor may control elements of the base station so as to configure DCIs of two layers including allocation information of a plurality of PDSCHs and transmit the same. A plurality of processors may be provided, and the processor may execute a program stored in the memory to perform an operation of controlling the elements of the base station.

The methods according to various embodiments described in the claims or the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A frequency multiplier of a wireless communication system, the frequency multiplier comprising:
   an input circuit to which a local oscillator (LO) signal is input;
   a multiplier circuit having one end connected to the input circuit and another end connected to a lower terminal of a load circuit;
   a load circuit having an upper terminal connected to a voltage controller; and
   the voltage controller configured between the upper terminal of the load circuit and an input power source,
   wherein the voltage controller is configured to drop a voltage between the input power source and the upper terminal of the load circuit and reinput a feedback voltage based on an upper terminal voltage of the load circuit to the voltage controller,
   wherein the voltage controller comprises a feedback circuit and an active load, and
   wherein the feedback circuit comprises a second variable resistor connected to the active load and a first variable resistor connected to the second variable resistor and the active load.

2. The frequency multiplier of claim 1,
   wherein an upper terminal of the first variable resistor is connected to the input power source and a lower terminal thereof is connected to an upper terminal of the second variable resistor and the active load, and
   wherein a lower terminal of the second variable resistor is connected to an upper terminal of the active load.

3. The frequency multiplier of claim 2,
   wherein the active load comprises at least one transistor, and
   wherein a source terminal of the transistor is connected to the input power source, a drain terminal of the transistor is connected to the upper terminal of the load circuit, and a gate terminal of the transistor is connected between the first variable resistor and the second variable resistor.

4. The frequency multiplier of claim 3, wherein a feedback voltage is input to the gate terminal of the transistor, based on the voltage of the upper terminal of the load circuit.

5. The frequency multiplier of claim 4, wherein the feedback voltage is determined based on a voltage difference between the input power source and the upper terminal of the load circuit, and a resistance ratio of the first variable resistor and the second variable resistor.

6. The frequency multiplier of claim 5,
   wherein the resistance ratio of the first variable resistor and the second variable resistor is determined based on at least one of a process characteristics of the frequency multiplier or external temperature, and
   wherein the resistance ratio is selected from a mapping table between at least one of the process characteristics of the frequency multiplier or the external temperature and a resistance value.

7. The frequency multiplier of claim 5, further comprising:
   an output circuit connected to a lower terminal of the load circuit,
   wherein output power of the output circuit is input to a mixer of a transceiver, and
   wherein the resistance ratio of the first variable resistor and the second variable resistor is adjusted such that the output power based on a voltage drop at the active load produces a maximum conversion gain level of the mixer.

8. The frequency multiplier of claim 1, wherein the input circuit comprises a transformer structure for generating input signals having opposite phases.

9. The frequency multiplier of claim 8, wherein the multiplier circuit comprises a pair of transistors configured as a differential pair.

10. The frequency multiplier of claim 9, wherein the input signals having the opposite phases are input to the pair of transistors of the differential pair.

11. A method performed by a frequency multiplier of a wireless communication system, the method comprising:
    receiving a local oscillator (LO) signal through an input circuit;
    multiplying the LO signal through a multiplier circuit having one end connected to the input circuit and another end connected to a lower terminal of a load circuit;
    performing a first voltage drop through the load circuit having an upper terminal connected to a voltage controller; and
    controlling a voltage through the voltage controller configured between the upper terminal of the load circuit and an input power source,
    wherein the voltage controller is configured to drop a voltage between the input power source and the upper terminal of the load circuit and reinput a feedback voltage based on an upper terminal voltage of the load circuit to the voltage controller,
    wherein the voltage controller comprises a feedback circuit and an active load, and
    wherein the feedback circuit comprises a second variable resistor connected to the active load and a first variable resistor connected to the second variable resistor and the active load.

12. The method of claim 11,
    wherein an upper terminal of the first variable resistor is connected to the input power source and a lower terminal thereof is connected to an upper terminal of the second variable resistor and the active load, and
    wherein a lower terminal of the second variable resistor is connected to an upper terminal of the active load.

13. The method of claim 12,
    wherein the active load comprises at least one transistor, and
    wherein a source terminal of the transistor is connected to the input power source, a drain terminal of the transistor is connected to the upper terminal of the load circuit, and a gate terminal of the transistor is connected between the first variable resistor and the second variable resistor.

14. The method of claim 13,
    wherein a feedback voltage is input to the gate terminal of the transistor, based on the voltage of the upper terminal of the load circuit, and
    wherein the feedback voltage is determined based on a voltage difference between the input power source and the upper terminal of the load circuit, and a resistance ratio of the first variable resistor and the second variable resistor.

15. The method of claim 14,
    wherein the resistance ratio of the first variable resistor and the second variable resistor is determined based on at least one of a process characteristics of the frequency multiplier or external temperature, and
    wherein the resistance ratio is selected from a mapping table between at least one of the process characteristics of the frequency multiplier or the external temperature and a resistance value.

16. The method of claim 14,
    wherein output power is input to a mixer of a transceiver through an output circuit connected to the lower terminal of the load circuit, and
    wherein the resistance ratio of the first variable resistor and the second variable resistor is adjusted such that the output power based on a voltage drop at the active load produces a maximum conversion gain level of the mixer.

17. The method of claim 11, wherein the input circuit comprises a transformer structure for generating input signals having opposite phases.

18. The method of claim 17,
    wherein the multiplier circuit comprises a pair of transistors configured as a differential pair, and
    wherein the input signals having the opposite phases are input to the pair of transistors of the differential pair.

* * * * *